United States Patent [19]

Butler et al.

[11] 4,002,513
[45] Jan. 11, 1977

[54] BUCKET-BRIGADE DELAY LINE HAVING REDUCED PARASITIC CAPACITANCES AND METHOD FOR MAKING THE SAME

[75] Inventors: Walter J. Butler, Scotia; Mark B. Barron, Camillus, both of N.Y.; Bruno F. Kurz, deceased, late of Schenectady, N.Y., by Elizabeth Kurz-Beerli, executrix

[73] Assignee: General Electric Co., Schenectady, N.Y.

[22] Filed: Feb. 25, 1975

[21] Appl. No.: 552,940

[52] U.S. Cl. .............................. 148/187; 148/175; 148/188; 357/24
[51] Int. Cl.² ...................................... H01L 21/225
[58] Field of Search ............... 148/187, 188, 175; 354/24; 357/24

[56] References Cited
UNITED STATES PATENTS 3,933,529   1/1976   Goser .............................. 148/188

OTHER PUBLICATIONS

"Structure & Fabrication of Self–Aligned Bucket Brigade (SABB)", Agusta et al., IBM Tech. Disc. Bull., v. 15, No. 1, June 1972, pp. 12, 13.

Primary Examiner—C. Lovell
Assistant Examiner—J. M. Davis
Attorney, Agent, or Firm—Stephen B. Salai; Joseph T. Cohen; Jerome C. Squillaro

[57] ABSTRACT

An MOS bucket brigade delay line having reduced parasitic capacitances and method for making the same, include a first set of diffused drain source regions in a semiconductor substrate, a thin gate oxide layer overlying said diffused regions, a plurality of gate electrodes having first and second edges, the first edge of each electrode substantially overlapping one of said diffused regions, each of these elements formed in conventional manner. A second set of diffused drain-source regions extends the first set of regions by an amount limited by the second edge of the gate electrodes. The second set of drain source regions is formed by utilizing the gate electrodes as a diffusion mask.

9 Claims, 19 Drawing Figures

PROVIDE CLEAN WAFER

FORM THICK OXIDE LAYER

PHOTOETCH FIRST PATTERN

DEPOSIT BORON

DIFFUSE IN BORON

PHOTOETCH SECOND PATTERN

FORM GATE OXIDE

DEPOSIT MOLYBDENUM

PHOTOETCH

DEPOSIT DOPED GLASS

DIFFUSE IN SOURCE EXTENSIONS

ETCH AWAY ALL BUT 1000Å OF DOPED GLASS

COVER WITH UNDOPED GLASS

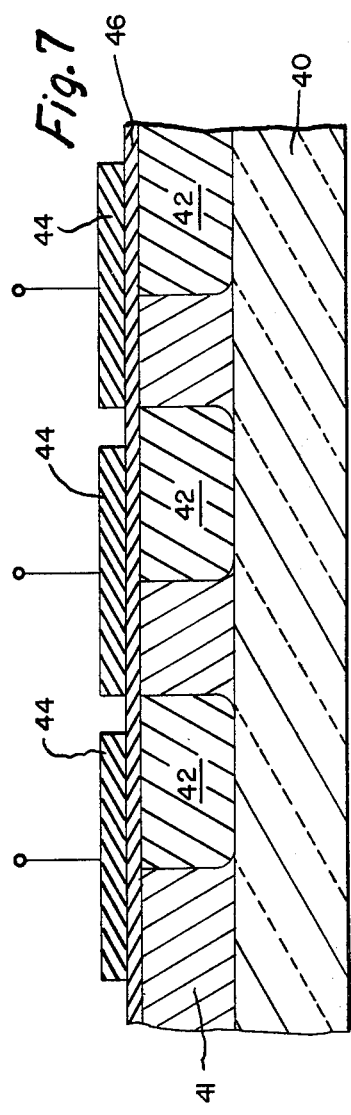
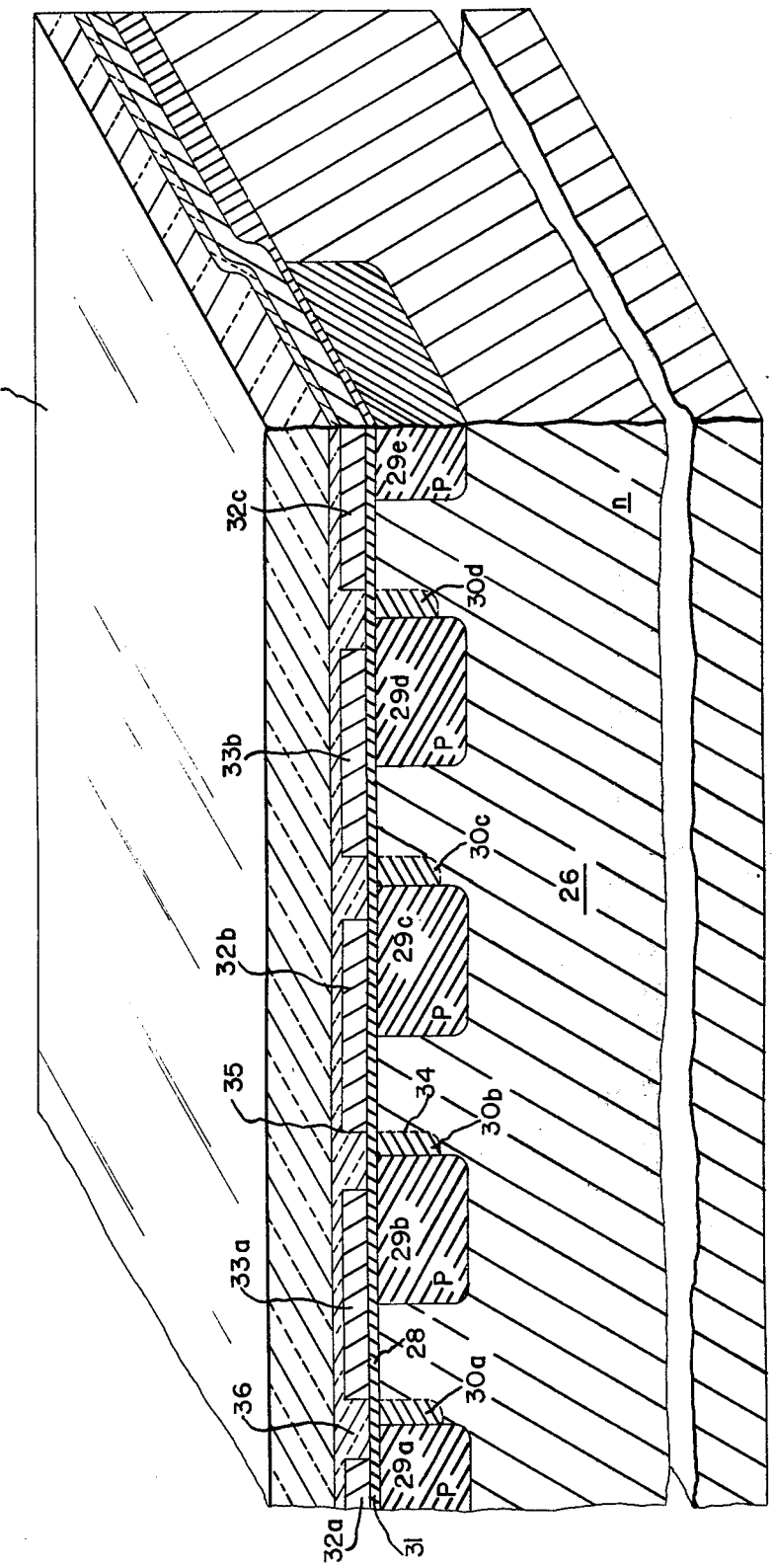

Fig. 6a  PROVIDE CLEAN WAFER
Fig. 6b  FORM THICK OXIDE LAYER
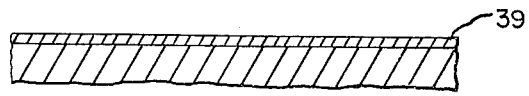
Fig. 6c  PHOTOETCH FIRST PATTERN
Fig. 6d  DEPOSIT BORON
Fig. 6e  DIFFUSE IN BORON
Fig. 6f  PHOTOETCH SECOND PATTERN
Fig. 6g  FORM GATE OXIDE
Fig. 6h  DEPOSIT MOLYBDENUM
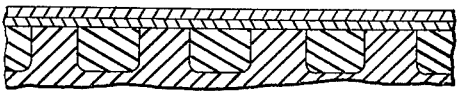
Fig. 6j  PHOTOETCH
Fig. 6k  DEPOSIT DOPED GLASS
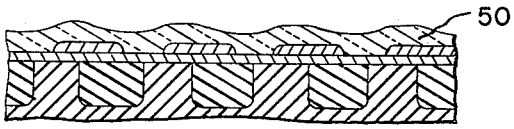
Fig. 6m  DIFFUSE IN SOURCE EXTENSIONS
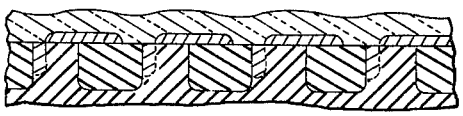
Fig. 6n  ETCH AWAY ALL BUT 1000Å OF DOPED GLASS
Fig. 6p  COVER WITH UNDOPED GLASS
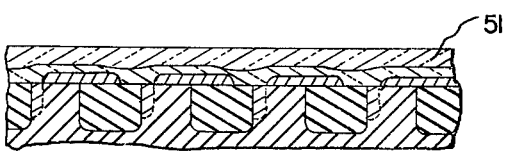

BUCKET-BRIGADE DELAY LINE HAVING REDUCED PARASITIC CAPACITANCES AND METHOD FOR MAKING THE SAME

This invention relates, in general, to bucket brigade delay lines, and more specifically to a metal-oxide-semiconductor bucket brigade delay line having reduced gate-to-source and drain-to-substrate parasitic capacitances over prior art types, and a method for making the same.

Bucket brigade delay lines of the type wherein the well known metal-oxide-semiconductor (MOS) structure is utilized are becoming increasingly important. This structure includes a relatively thick semiconductor substrate, a plurality of laterally spaced-apart drain-source regions formed in one major surface of the substrate in any convenient manner, as for example by diffusion, an insulating oxide layer overlying the substrate and the drain-source regions, and a plurality of metallized gate electrodes which overlie the oxide, and each of which partially overlies one of the drain-source regions. While the structure of the MOS bucket brigade delay line is relatively simple, the implementation thereof in physical form presents numerous problems. For example, the drain-source regions and the metallized gate electrodes are normally formed by processes involving the laying out of a mask, forming an image on the chip by any one of a number of well known photoresist processes followed by etching, diffusing and/or metal deposition steps. Since no less than two of these processes are required, obvious registration problems, that is to say alignment problems, are present. For example, considering the MOS bucket brigade structure hereinabove described, a typical method for making such a structure would be to form a plurality of drain-source regions by diffusing an impurity into the semiconductor substrate, this process being carried out by the type of photographic-masking hereinabove described, then forming an insulator region of a predetermined thickness overlying the active area of the substrate and finally forming metallized gate electrodes by another photograhic-etching step. The quality of the device formed in the preceding manner will depend in large part upon the accuracy and precision with which the metallized gate electrodes and the diffused drain-source regions may be located one with respect to the other. In an optimum structure, each of the metallized gate electrodes will overlie one and only one of the semiconductor drain regions, and the overlie in addition will be only partial. The extent to which the gate metallization overlies a second drain-source region determines the magnitude of the undesired gate to source parasitic capacitance hereinafter $C_{gs}$. In the prior art, insofar as is known, it has not been possible to achieve alignment accuracies exceeding 0.5 mil by the above-mentioned methods. The instant invention provides a full order of magnitude improvement thereover.

A second undesired parasitic capacitance present in the usual MOS bucket brigade delay line structure is the capacitance between the drain region and the substrate, hereinafter $C_{db}$. This capacitance which arises at any reverse biased pn junction, contributes along with the gate to source capacitance hereinabove described to the reduction of the dynamic range of the MOS bucket brigade delay line.

It is an object therefore, of this invention to provide an MOS bucket brigade delay line having substantially reduced parasitic capacitances over prior art types.

It is another object of this invention to provide a method for making a bucket brigade delay line having reduced parasitic capacitances which is easy to implement and provides exceptional registration accuracy without the need for extremely precise mask alignment.

It is yet another object of this invention to provide a bucket brigade delay line having reduced drain to substrate capacitance and a method for making the same.

Briefly stated, and in accordance with one aspect of this invention, a method for making a high dynamic range MOS bucket brigade delay line comprises the steps of diffusing a plurality of laterally spaced apart drain-source regions into a semiconductor substrate in a predetermined pattern, forming a gate oxide region on the surface of the semiconductor wafer overlying said spaced apart drain regions, depositing a plurality of metallized gate electrodes on the surface of said oxide layer, each of said metallized electrodes partially overlying one of said drain regions, and finally, extending said drain regions by an additional diffusion step utilizing said metallization electrodes as a diffusion mask. An MOS bucket-brigade delay line in accordance with this process achieves a registration alignment between the diffused drain-source regions and the gate electrodes exceeding by a full order of magnitude that obtainable by prior art methods. Accuracies of 2 microns are achievable.

The features of the invention which are believed to be novel are pointed out with particularity in the appended claims. The invention itself, however, both as to its organization and method of operation together with further objects and advantages thereof may best be understood by reference to the following description taken in connection with the accompanying drawings in which:

FIG. 5 is a perspective view of a bucket brigade delay line in accordance with this invention.

FIG. 6 is a flow diagram illustrating a process utilized in forming an MOS bucket brigade delay line in accordance with this invention.

FIG. 7 is a section view of a bucket brigade delay line in accordance with yet another aspect of this invention.

Figure 1:
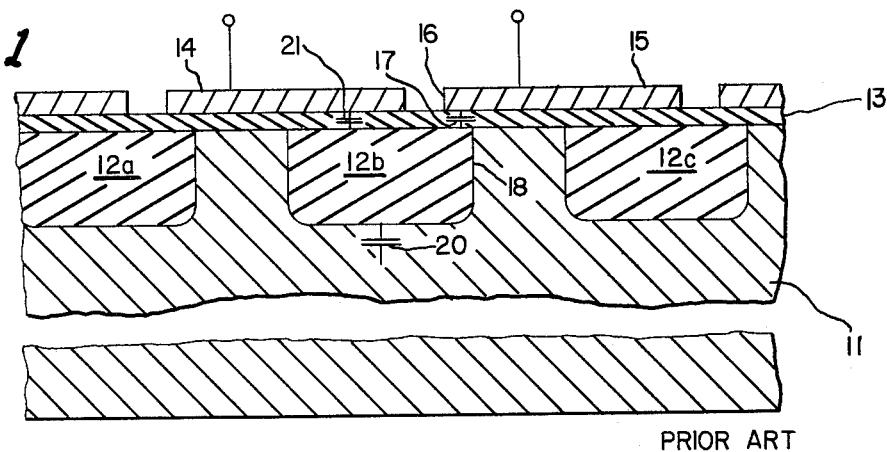
FIG. 1 is a section view of an MOS bucket brigade delay line in accordance with the prior art.

FIG. 1 is a section view of an MOS bucket brigade delay line in accordance with the prior art. Substrate 11, which is typically a doped crystalline silicon wafer is provided with a plurality of diffused drain-source regions 12a–c. Substrate 11 and diffused regions 12a–c are typically doped with impurity atoms such that the conductivity of the diffused regions is opposite the conductivity of substrate 11. For example, diffused regions 12 may be p-type diffusions while substrate 11 is n-type. Oxide layer 13, which typically is a relatively thin layer of silicon dioxide overlies the active region of the substrate 11 which includes the diffused regions 12. Metallized electrodes 14 and 15 overlie oxide layer 13.

Devices of the type illustrated in FIG. 1 are generally constructed by providing the silicon substrate 11, duffusing therein a plurality of regions 12a–c by means of a photographic process which involves exposing the treated surface of the silicon substrate 11 to light through a mask so that a pattern is formed on said surface corresponding to the placement of the diffused regions 12 as desired, and as is well known to one skilled in the art. A layer of impurity atoms is then applied to the surface of the substrate 11 and then diffused into the substrate by the application of heat in the well known manner. Any excess impurity atoms are cleaned from the surface of substrate 11 and oxide layer 13 is then formed thereon. Metallizations 14 and 15 are deposited on the surface of oxide layer 13 by a second procedure similar to that used to define the location of diffused regions 12. It is necessary therefore, that a second mask be applied to the now multilayered device, that the wafer be exposed to light, and that regions 14 and 15 be formed in the desired locations. Alternately, it may be preferable to apply a metallization to the entire surface of the wafer, and etch away those portions which are not desired. In either of these methods it is clear that precise manufacturing methods will be required to insure accurate alignment of diffused regions 12a–c and metallizations 14 and 15. The optimum alignment involves each of metallizations 14 and 15 overlapping a single one of diffused regions 12a–c and extending towards but not overlapping the preceding regions. It is desired that any overlap indicated in FIG. 1 as capacitance 17, be as small as possible. It is necessary, however, that edge 16 of metallization 15, for example, be sufficiently close to the edge 18 of diffused regions 12b in vertical alignment that when a voltage is applied to the metallization 15 inversion takes place on the surface of substrate 11 so that proper operation may occur. In accordance with the prior art therefore, it was necessary to tolerate a certain amount of overlap as represented by capacitance 17 in order to insure proper operation of the device.

Figure 2:
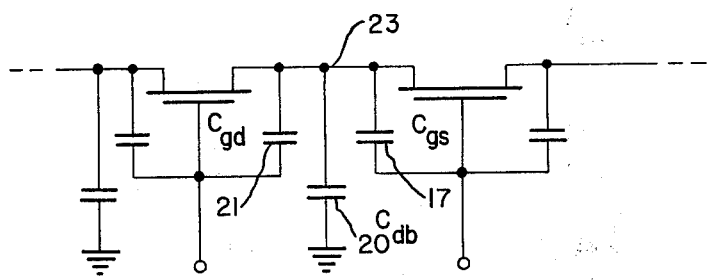
FIG. 2 is a schematic diagram of a section of a bucket brigade delay line showing the various parasitic and storage capacitances.
Figure 3:
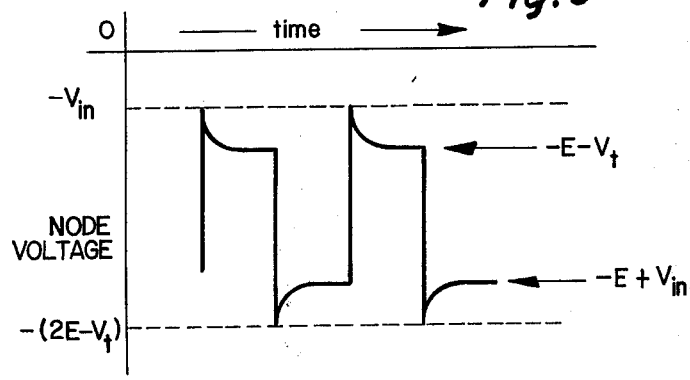
FIG. 3 is a graphical representation of the voltage at a typical node of an ideal bucket brigade delay line.
Figure 4:
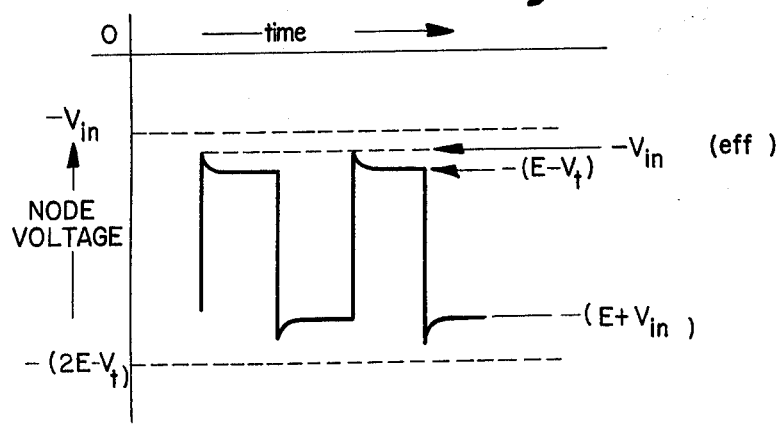
FIG. 4 is a graphical representation of a voltage waveform at a typical node of an actual bucket brigade delay line showing the effects of the parasitic capacitances which are present.

FIG. 2 is a schematic representation of the structure illustrated in FIG. 1. It is to be appreciated that in both FIGS. 1 and 2 only a portion of an actual bucket brigade delay line is illustrated. In practice, the structure of FIG. 1 and a schematic of FIG. 2 would be extended to include a plurality of stages depending upon the delay required, and input and output stages of any desired type. The capacitances illustrated in FIG. 2 fall roughly into three general types. The reference numerals used to designate the capacitances in FIG. 2 and FIG. 1 are the same so that the physical phenomena which result from the parasitic capacitances which are substantially eliminated in accordance with this invention may be easily seen. For example, previously mentioned parasitic capacitance 17 may be represented as a gate to source capacitor, $C_{gs}$, 17 in FIG. 2. Similarly, drain to substrate capacitance $C_{db}$ 20 is the capacitance between the diffused region 12b and the substrate 11. Storage capacitor $C_{gd}$ 21 is the capacitance due to the overlap between gate electrode 14 and diffused region 12. It is to be appreciated that while these capacitances are illustrated for a single stage of the BBDL, that they are present in all stages. The deleterious effects of parasitic capacitances 17 and 20 may be more easily understood by referring now to FIGS. 3 and 4 wherein the voltage at a selected node of an operating bucket brigade delay line is plotted as a function of time. FIG. 3 illustrates the node voltage of an ideal bucket brigade delay line, that is one having no parasitic capacitances, while FIG. 4 illustrates the node voltage of a bucket brigade delay line of the type illustrated in FIG. 1. In both instances, the vertical and horizontal scales are identical. The vertical scale being in volts, extending from zero to $-(2E-V_t)$ where E is the clock voltage and $V_t$ is the threshold voltage of the MOS device measured between the source and the gate thereof. It is to be understood that the node voltage is measured between the drain of a selected MOS device as, for example, node 23 of device 12 in FIG. 2 and the substrate or ground. It is clear that the input voltage, $-V_{in}$, must be constrained to lie between substantially zero volts and $-(E-V_t)$ as illustrated in FIG. 3.

The waveform illustrated in FIG. 4 shows the effects of the gate-to-source and drain-to-substrate parasitic capacitances on the node voltage. It can be shown that the effective value of the input voltage is changed by the presence of the aforementioned parasitic capacitances. Specifically, the effective input voltage may be expressed as:

$$V_{in}(\text{eff}) = V_{in} + \frac{E(C_{db} + 2 C_{gs})}{C_{gd} + C_{gs} + C_{db}}$$

wherein $V_{in}$ (eff) is the effective input voltage taking into account the parasitic capacitances, $V_{in}$ is the actual input voltage, E is the clock voltage, and the various capacitances are as hereinabove described. It is clear that the effect of the parasitic capacitances is to reduce the range within which $V_{in}$ must lie. For example, if we assume the following actual values for the various voltages and capacitances,

| E = 10 volts | $C_{db}$ = 0.1 pf |
|---|---|
| $V_t$ = 2 volts | $C_{gs}$ = 0.1 pf |
| | $C_{gd}$ = 1.0 pf | it can be seen by referring now to FIG. 3 and ignoring for the moment the effects of the parasitic capacitances, $V_{in}$ may vary between zero and $-8$ volts, a swing of $\pm 4$ volts. Substituting the above values into equation 1, it can be seen that the effective value of $V_{in}$ will shift by 2.5 volts and that the maximum allowable input voltage swing is now $\pm 2.75$ volts. It is clear therefore, that a decrease in dynamic range of approximately 30% results.

FIG. 5 illustrates an MOS bucket brigade delay line in accordance with this invention which substantially eliminates the parasitic capacitances responsible for the degradation of performance as hereinabove described. As shown, the device is constructed on a substrate 26 of n-type silicon into which a first set of laterally spaced apart p-type regions are formed, which regions extend from the surface 28 into the bulk of substrate 26. It is to be understood that while an n-type substrate and p-type diffusions are illustrated, the invention is not so limited, and polarity types may be reversed where desired. These regions, 29a–e are the drain-source regions of the MOS devices which comprise a portion of the delay line. A second set of similar regions 30a–d each of which is contiguous with one of the regions 29a–d, extend laterally therefrom a distance determined as hereinbelow described. A thin oxide layer 31 which is the gate oxide of the MOS devices insulates semiconductor regions 29 and 30 from a series of metallizations 32 and 33, formed of a refractory metal as, for example, molybdenum. Each of the metallizations overlaps one of the drain-source regions 29 by a substantial amount, thus creating a capacitance therebetween which is the storage capacitance of the bucket brigade delay line. Each of metallizations 32 and 33 extends in the opposite direction towards the preceding drain-source diffusion. Each of metallizations 32 is electrically connected to all of the metallizations 32 by convenient means (not shown) and similarly for metallizations 33. In order to minimize the gate-source parasitic capacitances, it is desired that the vertical alignment between the edge 34, for example, of drain-source region 30b be as accurately as possible aligned with edge 35 of gate metallization 32b, and likewise for remaining drain-source regions and metallizations. A layer of impurity doped glass 36 overlies gate electrodes 32 and 33 and oxide layer 31. This layer of doped glass provides, during the fabrication of the device, impurity atoms for creating diffused regions 30. A layer of substantially pure glass 37 overlies the aforementioned portions of the device providing isolation therefore from the environment. It is to be understood that metallizations 32 and 33 are provided with terminals for connection to external equipment in the conventional bucket brigade manner. These connections are not shown.

FIG. 6 is a flow diagram of a method in accordance with this invention for forming an MOS bucket brigade delay line of the type illustrated in FIG. 5. While the process to be described will assume the use of an n-doped silicon wafer and p-doped regions diffused therein, it is to be understood that where desired, the polarities of the wafer and diffused regions may be reversed.

FIG. 6a illustrates the silicon wafer 26 which is the substrate upon which the MOS bucket brigade delay line in accordance with this invention is constructed. The wafer is first cleansed of any impurities to form a surface 38 upon which an oxide layer 39 is formed as illustrated in FIG. 6b. Typically, this oxide layer is formed by exposing the wafer to a suitable oxidizing environment at high temperature for a period of time sufficient to form the oxide layer in the thickness required. For example, an oxidizing environment of steam at a temperature of 1050° C may be used, and an oxide thickness of 8300 Angstroms is acceptable. It is to be understood that except as shall be hereinbelow noted, the various dimensions, times, and temperatures given in the description of this process are typical, and may vary somewhat depending upon the particular structure desired.

FIGS. 6c through 6e illustrate the formation of diffused source-drain regions 12. The diffusions are formed by conventional methods, as for example photo-lithographic methods, wherein the surface of the oxide is coated with a photosensitive material which is then exposed to a light source through a mask whereby the image of the mask is transferred to the photosensitive material. The undesired oxide regions may then be etched away, as for example, by etching in buffered hydrofluoric acid exposing the silicon substrate beneath. As hydrofluoric acid exposing the silicon substrate beneath. As illustrated in FIGS. 6c it is desired to remove the oxide where the diffused regions are to be formed. A suitable doping material is then deposited on the surface of the wafer as shown in FIG. 6d. In this example, boron is used and is deposited by exposing the wafer to a boron rich atmosphere at an elevated temperature, for example, 950° C, for a period sufficient to form a desired thickness, for example, 30 minutes. The actual diffused regions 12 are formed by heating the boron-coated wafer to high temperature for a period of time sufficient to form diffusion regions of the desired thickness, for example, 1175° C for 60 minutes. The active region of the semiconductor device, that is to say the region which comprises the delay line portion of the device is now formed. In a manner similar to that hereinabove described, the active region is exposed through a mask which will define the boundaries thereof. It is then etched and a thin gate oxide layer 31 is formed thereon as illustrated in FIGS. 6f and 6g. Oxide layer 13 is a dry oxide having a thickness of approximately 1000 Angstroms. This layer is formed by exposing the wafer to dry oxygen at 1100° C. A refractory metal is now deposited on the surface of the dry oxide 31 as shown in FIG. 6h. This metal may be any refractory metal such as, for example, molybdenum or tungsten. The metal is deposited to a thickness of approximately 3000 Angstroms. A third photoetching step now defines the placement of the desired metal regions. As before, a mask is used to expose a photosensitive material to light and the undesired regions are etched away.

The alignment tolerance of the refractory metal regions with the diffused regions differs substantially from that required in the prior art. It must be appreciated that in order to form a functional field effect device, it is necessary that the field created by the metallization extends substantially into the source and drain regions to form a channel therebetween underlying the metallization. In the case of an MOS bucket brigade device, since there exists a substantial overlap between each metallization and one of the diffused p regions, it is required that the edge of the metallization be in close vertical alignment with the preceding diffused in p-type region in order to permit proper channel formation. In prior art devices, this has been accomplished by providing a small overlap between the diffused regions and the subsequently applied metallizations. This overlap insured that a channel would form between successive p-type regions when various alignment tolerances were taken into consideration.

In accordance with this invention, and referring now to FIG. 6j it will be noted that the metallization regions 14 and 15, for example, overlap p-type diffusions 12b and 12c by a substantial amount, but they do not overlap the preceding diffusions. As the alignment requirements for the large overlap are not severe, photo-lithographic methods yield an acceptable result during this step.

It should be appreciated that at this point in the process described, the wafers have the metallization regions applied. It is therefore necessary to exercise care in any subsequent cleaning steps to avoid damaging the metallizations. For example, except as hereinbelow described, acid clean-ups must be avoided. A suitable method for cleaning the wafers at this time comprises boiling in propanol, rinsing in acetone, rinsing in distilled water, and cleaning in hot sulfuric acid only.

As shown in FIG. 6k, a layer of glass 50 doped with impurity atoms is now applied over the metallization regions. For example, borosilicate glass may be used at a thickness of approximately 4000 Angstroms covered by 500 to 600 Angstroms of an undoped glass such as silicon dioxide. It is to be noted that during this step and the diffusion step illustrated in FIG. 6m to follow, the metallization regions perform the function of a mask to define the lateral extent of diffusion. The diffusion itself is accomplished by driving the boron impurity atoms through the thin gate oxide region to extend the previously diffused p-type regions to the edges of the metallization regions. This diffusion is accomplished by exposure to a high temperature, for example, 1100° C in an argon environment. This diffusion extends the previously diffused drain-source regions until they are in vertical alignment with the boundaries of metallizations 14 and 15, for example, without the need for precise alignment of photographic masks. In this way, the overlap which existed between the metal electrodes 14 and 15 and the diffusions 12a and 12b, respectively, in the prior art devices is substantially eliminated. Therefore the parasitic capacitances, associated with the aforementioned prior art devices are reduced to substantially zero. FIGS. 6n and 6p illustrate the finishing steps wherein all but a thin layer of impurity doped glass is etched away and nondoped protective glass layer 51 is applied. A thin layer of impurity doped glass is retained to avoid damage to the gate electrodes during the etching process. An MOS bucket brigade delay line in accordance with this invention, therefore, exhibits greatly increased dynamic range over prior art types.

The MOS bucket brigade delay line hereinbefore described along with the method of manufacture thereof, provides a device having greatly reduced gate-source parasitic capacitance. While greatly enhanced operation may be achieved by the practice of the method as hereinabove described, it is possible to even further increase performance by reduction of the drain to substrate capacitance.

FIG. 7 is a simplified section view of a metal-oxide-semiconductor-insulator, MOSI structure in accordance with another aspect of this invention. Only the active elements are shown. The device is formed on an insulator 40 which may conveniently be made of sapphire or a similar material. A first semiconductor region 41 is formed on one major surface of insulator 40 and is of a first conductivity type in this instance n-type. A plurality of semiconductor regions 42 of the opposite conductivity type are formed, for example, by diffusion extending through said first semiconductor type 41 to the surface of insulator 40 completely eliminating any channel of first semiconductor type 41. It is to be understood that while the structure in FIG. 7 is shown in section view, that the semiconductor regions 42 are isolated one from the other to form a structure similar to that illustrated in FIG. 5. It is to be further understood that diffused semiconductor regions 42 are formed in two stages as described hereinabove in order to provide the precise alignment between the edges of semiconductor region 42 and metallizations 44. In this way, it is assured that not only will the drain-to-substrte capacitance be reduced to a minimum by substantially eliminating the p-n junction between the diffused drain-source regions and the substrate which is present in prior art devices, but leakage currents at the junctions will be minimized. As was hereinabove mentioned, it is to be understood that oxide layer 46 is formed in the manner described in conjunction with FIG. 5, and that a thin layer of doped glass (not shown) utilized in the second diffusion step will remain covering metallized electrodes 44 and that a cover glass (not shown) of substantially greater thickness but without impurity will provide protection for the completed device.

While the invention has been particularly shown and described with reference to several preferred embodiments thereof, it will be understood by those skilled in the art that various changes in form and detail may be made therein without departing from the true spirit and scope of the invention as defined by the appended claims.

What is claimed is:

1. A method for making a bucket brigade delay line comprising selectively diffusing a plurality drain-source regions of a first conductivity type into one surface of a substrate of opposite conducting type, forming a gate oxide layer on said surface, forming a plurality laterally spaced apart gate electrodes on said oxide layer, each of said gate electrodes having first and second laterally separated edges, said first edge overlapping one of said drain regions, diffusing extensions of said drain-source regions by utilizing said gate electrodes as a diffusion mask so that the lateral extent of said extensions is limited by said second edge.

2. The method of claim 1 wherein diffusing extensions of said drain regions comprises extending said regions in one lateral direction only.

3. The method of claim 2 wherein diffusing extensions of said drain regions comprises providing a source of impurity atoms overlying said metallized gate electrodes and said gate oxide layer and diffusing said impurity atoms into said substrate, through said oxide layer in the region not masked by said gate electrodes.

4. The method of claim 1 wherein forming a plurality of laterally spaced apart gate electrodes comprises forming a layer of a refractory metal overlying said gate oxide layer, and selectively removing said refractory metal in all but the desired locations.

5. The method of claim 4 wherein diffusing said extension of said drain-source regions comprises forming a layer of impurity doped glass overlying said gate electrodes and said gate oxide layer, and diffusing said impurities through said gate oxide layer into said substrate in the regions not masked by said gate electrodes.

6. The method of claim 5 wherein diffusing said impurities through said gate oxide layer comprising heating said doped glass to a high temperature so that impurity atoms diffuse therefrom into said substrate.

7. A method of making an MOS bucket brigade delay line of the type wherein a semiconductor layer overlies an insulating substrate comprising providing a wafer of crystalline silicon of a first conductivity type overlying an insulating substrate, diffusing a first plurality of regions of opposite conductivity type thru said silicon towards and meeting said insulating substrate, forming a gate oxide layer overlying said wafer, forming a plurality of metallized gate electrodes each of which has two laterally separated edges, a first edge substantially overlapping one of said first plurality of regions, and a second edge extending in the lateral direction towards a preceding one of said regions, diffusing extensions onto each of said region utilizing said metallized gate electrodes as a mask.

8. The method of claim 7 wherein diffusing said extensions comprises extending said regions in one lateral directly only.

9. The method of claim 8 wherein the lateral extent of diffusion is limited by said second edges of said metallized gate electrodes.

* * * * *